United States Patent [19]
Pinson

[11] Patent Number: 5,920,012
[45] Date of Patent: Jul. 6, 1999

[54] MICROMECHANICAL INERTIAL SENSOR

[75] Inventor: John Carver Pinson, Anaheim, Calif.

[73] Assignee: Boeing North American, Seal Beach, Calif.

[21] Appl. No.: 09/097,766

[22] Filed: Jun. 16, 1998

[51] Int. Cl.$^6$ .................................................. G01P 9/04
[52] U.S. Cl. ................... 73/504.12; 73/504.04; 73/514.32; 73/514.38
[58] Field of Search .................... 73/504.02, 504.03, 73/504.04, 504.12, 504.14, 504.15, 514.16, 514.29, 514.24, 514.32, 514.36, 514.38

[56] References Cited

U.S. PATENT DOCUMENTS

| | | | |
|---|---|---|---|
| 3,634,787 | 1/1972 | Newell | 310/8 |
| 4,654,663 | 3/1987 | Alsenz et al. | 73/505 |
| 5,126,812 | 6/1992 | Greiff | 357/25 |
| 5,349,855 | 9/1994 | Bernstein et al. | 73/505 |
| 5,359,893 | 11/1994 | Dunn | 73/505 |
| 5,495,761 | 3/1996 | Diem et al. | 73/514.32 |
| 5,561,246 | 10/1996 | Gruber et al. | 73/504.11 |
| 5,563,343 | 10/1996 | Shaw et al. | 73/514.18 |
| 5,605,598 | 2/1997 | Greiff | 156/630.1 |
| 5,780,740 | 7/1998 | Lee et al. | 73/504.12 |

*Primary Examiner*—Hezron Williams
*Assistant Examiner*—Helen C. Kwok
*Attorney, Agent, or Firm*—Alston & Bird, LLP

[57] ABSTRACT

A micromechanical inertial sensor includes a pair of proof masses suspended between a pair of fixed structures by beams attached between the ends of the proof masses and the fixed structures, such that the proof masses extend lengthwise along a first axis direction and are able to vibrate back and forth along a second axis substantially orthogonal to the first axis. Each beam attached to the proof masses has increased compliance in the first axis direction, relative to a linear beam of equivalent cross section, such that the beams have reduced resistance to stretching in the first axis direction as the proof masses vibrate in the second axis direction. In one embodiment of the invention, each beam is bowed or curved. Alternatively, compliance of the beam is increased by providing strain relief at one or both ends of the beam, or by providing an extensible portion in each beam.

12 Claims, 3 Drawing Sheets

MICROMECHANICAL INERTIAL SENSOR

FIELD OF THE INVENTION

The present invention relates to micromechanical inertial sensors for detecting rotational motions.

BACKGROUND OF THE INVENTION

Micromechanical inertial sensors are increasingly being used for detecting rotational motions in aircraft, automobiles, and other applications because of their extreme ruggedness and small size. Micromechanical inertial sensors also offer potentially significant cost advantages over competing technologies, and have the further advantage that a number of the sensors can be fabricated simultaneously.

A micromechanical gyro is known from U.S. Pat. No. 5,349,855 issued to Bernstein et al., the disclosure of which is incorporated herein by reference. The micromechanical gyro of Bernstein is a micromachined structure fabricated using a dissolved silicon wafer process with boron diffusion and dry etch process steps to define the final dimensions of the structure. The structure includes a pair of tuning fork elements which are electrostatically driven with opposite oscillatory phases such that they vibrate in a plane back and forth in a direction orthogonal to a sensing axis of the gyro. Rotation of the micromechanical gyro about its sensing axis causes the vibrating elements to experience Coriolis forces which make the elements vibrate out of the plane of their forced vibratory motion. The deflection of the elements out of this plane is detected and electronically converted into a measure of the rotational rate of the gyro.

The vibrating tuning fork elements, also known as proof masses, are suspended between a pair of structures that are mechanically grounded to a substrate of the gyro. The ends of the proof masses are connected to the mechanically grounded structures by beams which are etched out of the silicon wafer and are integrally formed with the proof masses.

One of the problems associated with micromechanical inertial sensors such as the type described in the Bernstein patent is that the proof masses are driven with relatively large amplitude vibrations relative to the lengths of the beams which attach the proof masses to the fixed structures. For example, the vibratory amplitude may be 20 percent of the beam length. Under these circumstances, the beams are deflected to relatively large angles, such that the stretching of the beams in their length direction is no longer negligible. Because the beams are generally much stiffer in their length direction than they are in bending, the result is that the restoring or spring force of each beam becomes nonlinear with the proof mass deflection in the vibratory direction. Consequently, the apparent natural resonant frequency of the proof mass becomes dependent on the vibration amplitude.

SUMMARY OF THE INVENTION

The present invention overcomes the drawbacks associated with prior micromechanical inertial sensors as noted above, by providing a micromechanical inertial sensor having reduced dependence of the resonant frequency on the drive amplitude of the proof masses. To this end, a proof mass of the sensor is suspended between a pair of fixed structures by beams which have increased compliance in their lengthwise direction so that the beams are better able to stretch under large bending deflections. Increased lengthwise compliance of a beam may be achieved by altering the beam itself relative to a linear beam, and/or by altering the configurations of the fixed structures and/or the proof masses where the beam is attached.

Thus, according to one embodiment of the invention, each beam is bowed or curved. Configuring the beam in this way makes the beam more compliant in the lengthwise direction of the beam. Accordingly, there is reduced tendency for the apparent natural resonant frequency of the proof mass to be dependent on the amplitude of vibration.

In accordance with a preferred embodiment of the invention, a micromechanical inertial sensor comprises a proof mass suspended between a pair of spaced-apart fixed structures such that the mass extends along a first axis and is adapted to vibrate along a second axis which is substantially orthogonal to the first axis. The proof mass is also deflectable along a third axis which is orthogonal to both the first and second axes. The sensor includes driven electrodes on the proof mass, and a driver which includes driving electrodes arranged adjacent the driven electrodes for electrostatically co-acting therewith so as to induce vibration of the proof mass along the second axis. The sensor further includes a sensor system for detecting position of the proof mass and providing a signal which varies with deflection of the proof mass in the third axis direction. The proof mass is suspended between the fixed structures by first and second beams which are connected to opposite ends of the proof mass and to the fixed structures. The beams are adapted to bend to permit forced vibration of the proof mass along the second axis and movement along the third axis.

Preferably, each end of the proof mass is suspended from the adjacent fixed structure by a pair of beams which are spaced apart in the second axis direction, and each beam is bowed or curved. The beams are preferably coplanar with the proof mass.

In accordance with an alternative preferred embodiment of the invention, each beam is generally straight and parallel to the first axis and is attached to one or both of the proof mass and the fixed structure by strain-relieved portions thereof. The strain-relieved portions include cut-outs defining attachment portions which connect the beam to the fixed structures and/or the proof masses. The attachment portions are relatively compliant in bending in the direction parallel to the first axis.

According to yet another preferred embodiment of the invention, each beam includes an extensible portion defined by a pair of bowed or curved legs which bound a cut-out in the beam. The bowed or curved legs impart the desired lengthwise compliance to the beam.

Increasing the compliance of the beams in their lengthwise direction has been found to substantially reduce the dependence of resonant frequency on the drive amplitude. The micromechanical inertial sensor of the present invention accordingly has improved accuracy potential relative to prior micromechanical inertial sensors.

BRIEF DESCRIPTION OF THE DRAWINGS

The above and other objects, features, and advantages of the invention will be made more apparent from the following description of certain preferred embodiments thereof, when taken in conjunction with the accompanying drawings in which.

DETAILED DESCRIPTION OF THE DRAWINGS

The invention is now explained by reference to certain preferred embodiments thereof. It is to be understood, however, that the invention is not limited to the particular embodiments described below.

Figure 1:
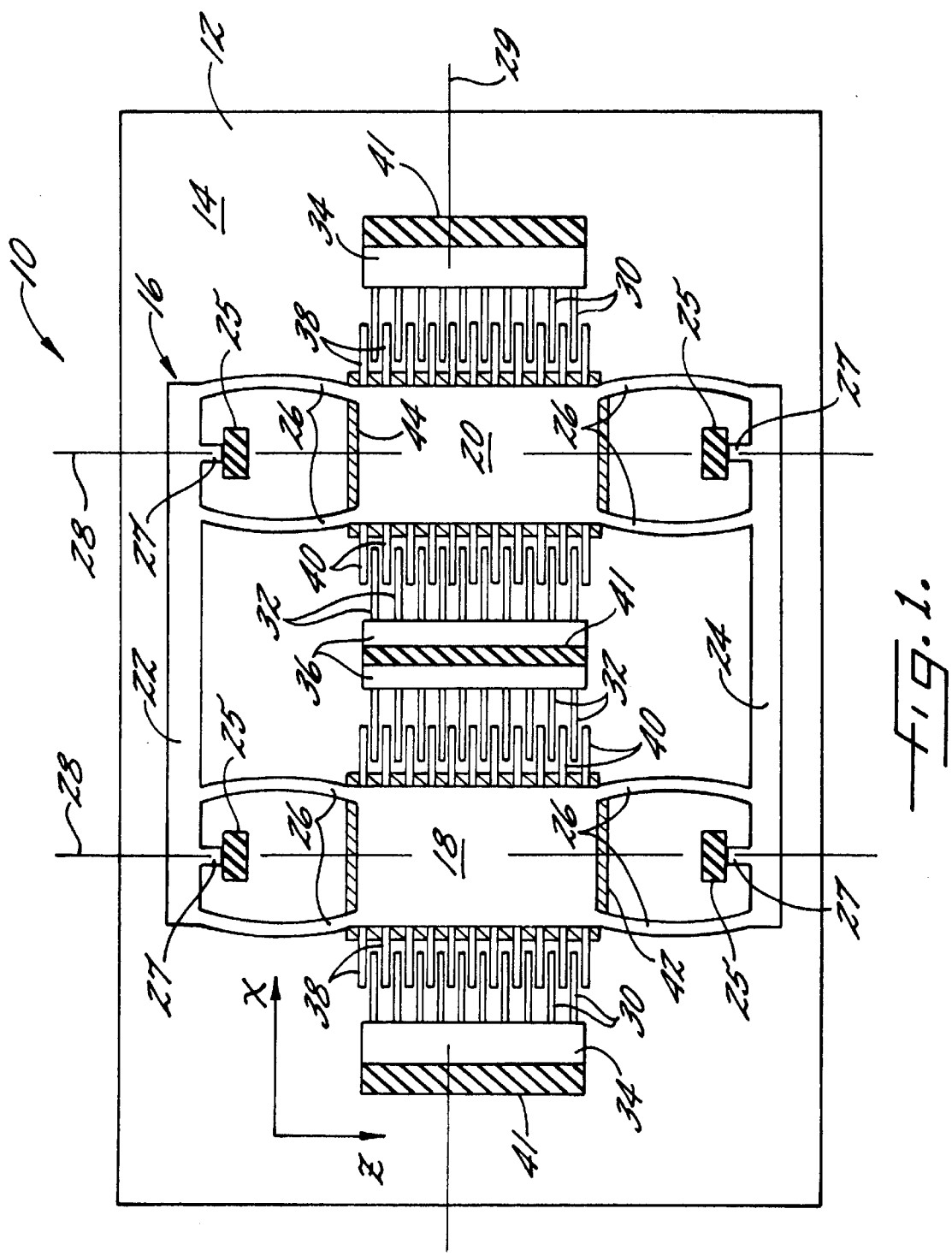
FIG. 1 is a top view of a micromechanical inertial sensor in accordance with a first preferred embodiment of the invention.

With reference to FIG. 1, a micromechanical inertial sensor in accordance with a first preferred embodiment of the invention is broadly indicated by the reference numeral 10. The micromechanical inertial sensor 10 comprises an integrally formed silicon proof mass structure which is typically formed by a number of dry etch and dissolved wafer process steps. For example, the structure can be etched from a silicon wafer that has been doped with boron. However, the proof mass structure can be formed of other materials and with other dopants if so desired. The proof mass structure is then anodically bonded to a glass substrate 12 which includes metal deposition regions providing electrical contacts for the inertial sensor. Techniques for manufacturing micromechanical sensors by etching silicon wafers are well known, as exemplified by the Bernstein patent, and are not further described herein.

The glass substrate 12 has a surface 14 which supports the proof mass structure 16 having a first proof mass 18 and a second proof mass 20. The proof masses 18 and 20 are suspended above the surface 14 between two spaced-apart and generally parallel fixed structures such as cross-pieces 22 and 24. The proof masses 18 and 20 preferably are attached to the cross-pieces 22 and 24 by pairs of beams 26 connected to each end of the proof masses, and the proof masses 18 and 20 each extends along a first or Z axis 28 running perpendicularly from one cross-piece to the other. The cross-pieces are attached to mechanical grounds 25 on the substrate 12 by short beams 27 attached to the cross-pieces at locations between the beams 26 of each beam pair. The beams 26 suspend the proof masses 18 and 20 above the surface 14 of substrate 12 such that the proof masses are free to move in the direction of a Y axis (not shown) which is orthogonal to the first or Z axis 28 and which extends normal to the plane of FIG. 1, i.e., the proof masses can move out of the plane of the proof mass structure 16.

The proof masses 18 and 20 are electrostatically driven to vibrate in the direction of a second or X axis 29 of the sensor which is orthogonal to both the Z axis 28 and the Y axis (not shown). The proof masses are driven at their natural resonant frequencies in the X axis direction. Rotation of the sensor 10 about an axis parallel to the Z axis 28 causes the proof masses 18 and 20 to deflect in the Y-axis direction out of the plane of their forced vibration, and these deflections are measured and converted into a measure of the rotational rate of the sensor 10.

Forced vibration of the proof masses 18 and 20 is accomplished by drive electrodes 30 electrically connected to drivers 34 and located adjacent outside edges of the proof masses 18 and 20, the drive electrodes interacting with driven electrodes 38 attached to the proof masses 18 and 20. The drive electrodes 30 comprise a plurality of teeth-like electrodes forming a comb structure extending from the drivers 34 toward the outside edge of each of the proof masses 18 and 20. Likewise, the driven electrodes 38 comprise teeth-like electrodes forming comb structures and extending from the outside edges of the proof masses toward the drivers 34 and interleaved with the drive electrodes 30. Similarly, the inside edges of the proof masses include teeth-like electrodes 40 forming comb structures which extend inwardly and are interleaved with teeth-like electrodes 32 that are electrically connected to motion sensors 36.

The drivers 34 and sensors 36 are affixed to mechanical grounds 41 on substrate 12.

The drivers 34 are synchronously driven in an oscillatory manner between two opposite polarities so as to force vibratory motion of the proof masses 18 and 20 along the X axis direction. The vibratory motion is sensed by the sensors 36 by interaction of the electrodes 40 on the masses with the electrodes 32 on the sensors 36, and the sensed motion is used to make the force so that the device is a self-oscillator at its natural resonant frequency.

The micromechanical inertial sensor 10 also includes a sensor system, typically comprised of sense electrodes 42 and 44 formed on the substrate 12 that are capacitively coupled with the proof masses 18 and 20, respectively, for detecting deflection of the proof masses out of their normal vibratory planes. The sense electrodes 42 and 44 provide output signals varying with deflection of the proof masses 18 and 20 along the Y axis. The operation of the driving and sensing electronics in a micromechanical inertial sensor is described in the Bernstein patent.

In a conventional micromechanical inertial sensor such as the one described in the Bernstein patent, the beams which connect the ends of the proof masses to the cross-pieces are generally linear beams. Large amplitude vibrations of the proof masses result in large bending deflections of the linear beams, and the beams are therefore stretched in their lengthwise direction. However, the beams are quite stiff in the lengthwise direction, and accordingly, the resonant frequency of the proof mass vibration becomes dependent on the amplitude of vibration at large vibration amplitudes.

The present invention employs beams which are made more compliant in the lengthwise or Z direction such that the dependence of resonant frequency on the vibration amplitude is reduced. Thus, as shown in FIG. 1, a first preferred embodiment of the invention includes beams 26 which are bowed or curved. The beams 26 advantageously are coplanar with the proof masses 18 and 20, and with the cross-pieces 22 and 24, and therefore are curved in the plane of the silicon structure 16. However, the beams need not be curved in the plane of the structure 16 but may be curved out of the plane of the structure 16. For example, the beams may be bowed in any plane which is parallel to the first axis 28. Furthermore, each beam need not lie in a plane, but may have a three dimensional curved shape. Moreover, although each beam 26 is shown as being smoothly curved, the beam may alternatively be formed of two or more linear segments that are angled relative to each other to form a bowed beam.

By forming the beams 26 as bowed or curved beams, the beams are made more compliant in the direction of the first axis 28. As a result, the beams 26 function more like linear springs at large vibration amplitudes, and therefore the natural resonant frequency of the proof masses 18 and 20 are less dependent on vibration amplitude. For example, it has been found that frequency shifts between low-amplitude and full-amplitude vibration can be reduced by more than a factor of 50 by incorporating beams in accordance with the present invention.

Figure 2:
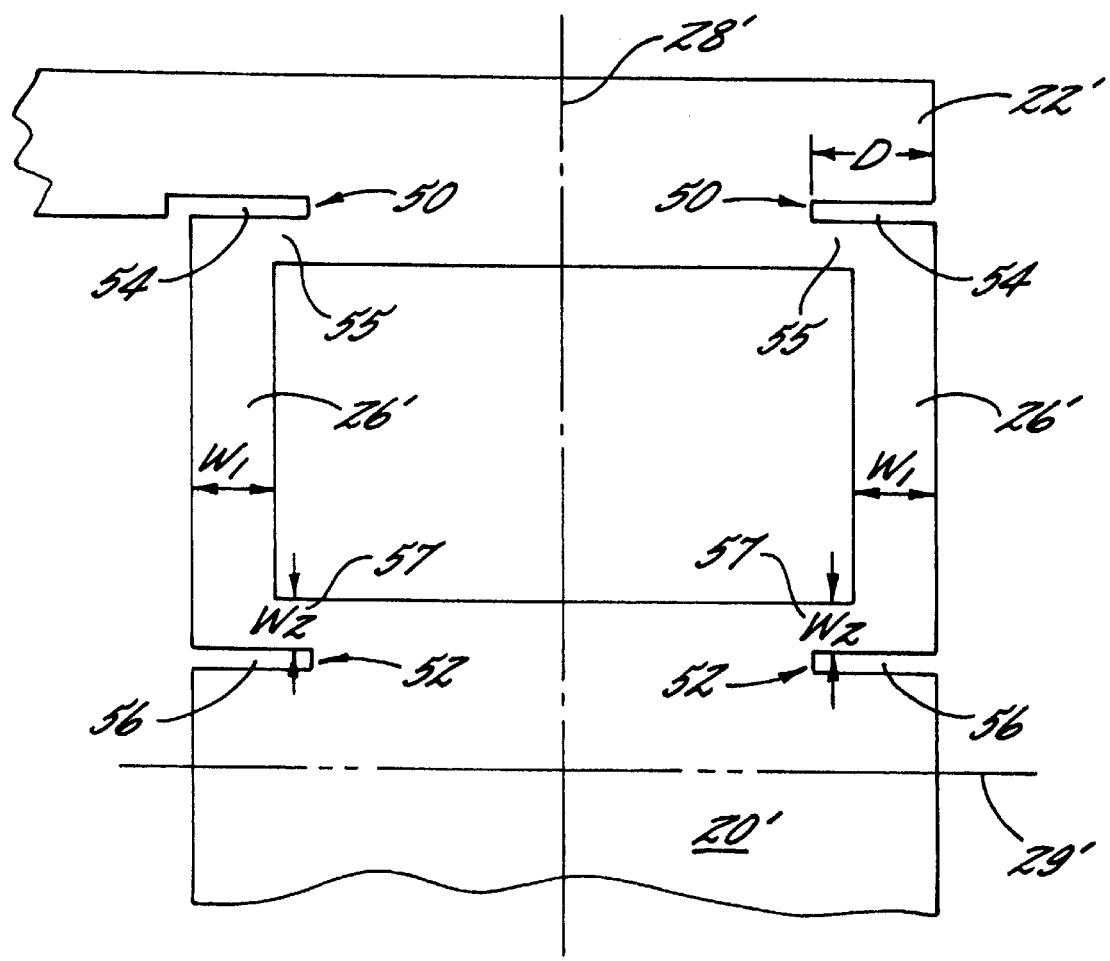
FIG. 2 is a fragmentary top view of a portion of a micromechanical inertial sensor in accordance with a second preferred embodiment of the invention.

FIG. 2 depicts an alternative embodiment of an inertial sensor employing straight beams 26' wherein increased beam compliance is provided by strain relief at the connections between the beams 26' and the proof mass 20' and between the beams 26' and the cross-piece 22'. It will be understood that the other proof mass (not shown) includes similar beams 26' connected to cross-piece 22', and that the opposite ends of both proof masses are connected by beams 26' to the other cross-piece (not shown). The beams 26' are attached to the cross-piece 22' and proof mass 20' at strain-relieved portions 50 and 52, respectively. Strain-relieved portions 50 are formed by making cut-outs 54 in the cross-piece so as to define an attachment portion 55 which connects each beam 26' to the cross-piece 22'. The attachment portions 55 are relatively compliant in bending in the direction parallel to the first axis 28'. Similarly, strain-relieved portions 52 are formed by making cut-outs 56 in the proof mass 20' so as to define an attachment portion 57 which connects each beam 26' to the proof mass and which is relatively compliant in bending in the direction parallel to the first axis 28'.

In the embodiment shown in FIG. 2, attachment portions are provided by making cut-outs in the cross-pieces and proof masses that are rectangular in shape and open on one side. However, it will be appreciated that many different configurations of cut-outs may be made for providing compliant attachment portions for the beams. In order to create attachment portions 55, 57 that are sufficiently compliant for the purposes of the invention, the cut-outs 54, 56 preferably have a depth D that equals or exceeds the width $W_1$ of the corresponding beams 26'. Moreover, the cut-outs are preferably defined in the cross-piece 22' and the proof mass 20' such that the width $W_2$ of the attachment portions is less than the width $W_1$ of the corresponding beams 26' as shown in FIG. 2.

Figure 3:
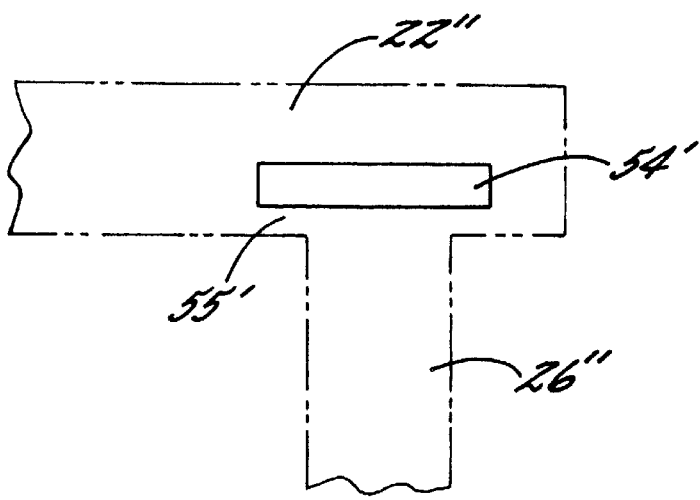
FIG. 3 is a fragmentary view of a beam and cross-piece, showing a third preferred embodiment of the invention.

FIG. 3 depicts an illustrative example of an alternative embodiment in which an attachment portion 55' is formed for attaching the beam 26" to the cross-piece 22" by forming a closed cut-out 54' in the cross-piece 22".

Figure 4:
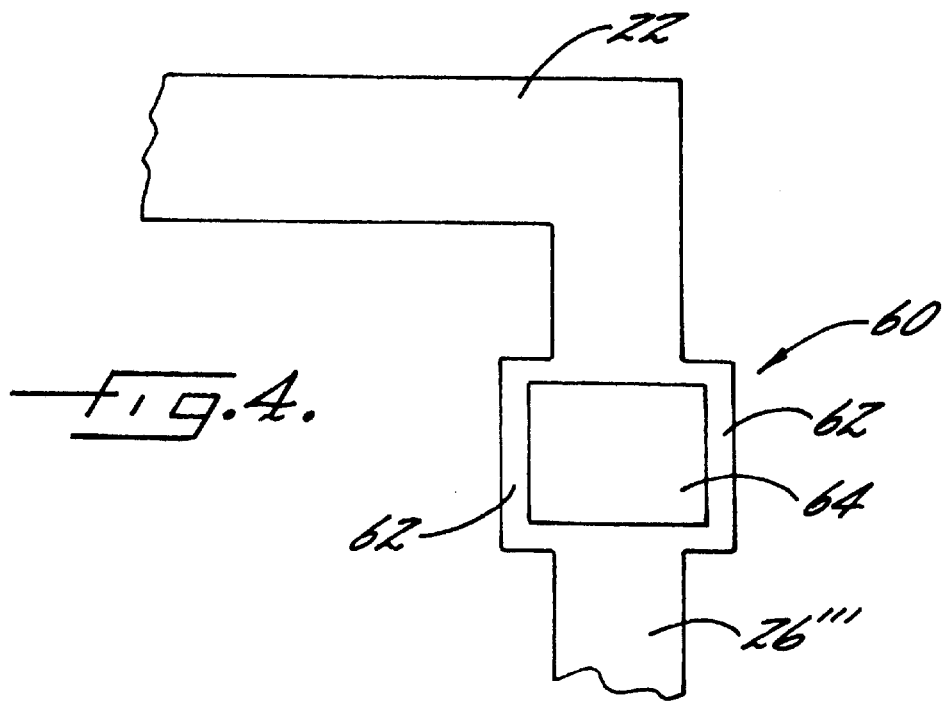
FIG. 4 is a view similar to FIG. 3, showing a fourth preferred embodiment of the invention.

The embodiments described thus far have included strain-relieving features in the cross-pieces and/or the proof masses where the ends of the beams are attached. However, the invention also includes micromechanical inertial sensors in which strain relief is provided by forming the beams themselves to have extensible portions for imparting lengthwise compliance to the beams. FIG. 4 depicts one embodiment of such a sensor. The beam 26''' includes an extensible portion 60 defined by a pair of bowed legs 62 which bound a cut-out 64 formed in the beam. The bowed legs 62 permit the beam 26''' to be stretched lengthwise during large bending deflections thereof. It will be appreciated that although the cut-out 64 is shown as being rectangular or square and the bowed legs 62 are depicted as being made up of linear segments joined at right angles and defining a square or rectangular structure having its sides arranged parallel and perpendicular to the length of the beam, many different configurations of cut-outs and bowed legs may be used.

Figure 5:
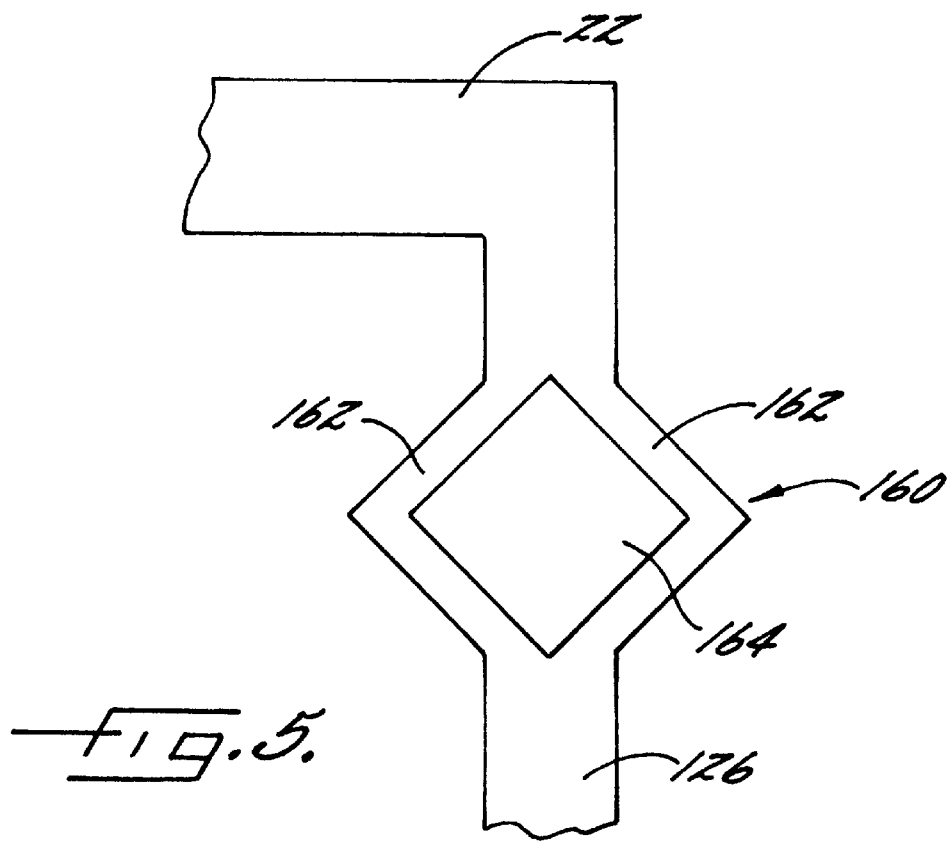
FIG. 5 is a view similar to FIGS. 3 and 4, showing a fifth preferred embodiment of the invention.

For example, FIG. 5 depicts an embodiment of the invention in which an extensible portion 160 is formed in the beam 126 by bowed legs 162 which bound a diamond-shaped cut-out 164 to define a diamond-shaped structure having its sides arranged obliquely to the length of the beam. Other types of polygonal or non-polygonal cut-outs may be used. Additionally, it will be appreciated that smoothly curved legs may be used instead of the angularly shaped legs as depicted in FIGS. 4 and 5.

In the various preferred embodiments described herein, increasing the compliance of the beams in the first axis direction makes the beams behave more like linear springs, and thereby mitigates the tendency of the natural apparent resonant frequency of the proof masses to increase with increasing vibration amplitude. As a result, enhanced accuracy of the micromechanical inertial sensor is made possible.

While the invention has been explained by describing in considerable detail a number of preferred embodiments of the invention, it is to be understood that the invention is not limited to the details of these embodiments, and various modifications and substitutions of equivalents can be made without departing from the scope of the invention. For example, the micromechanical inertial sensor having bowed or curved beams is described herein as having the two beams of each beam pair bowed away from each other and bowed to an equal degree, and as having all of the beam pairs identical to one another. However, in certain applications it may be advantageous to bow the two beams of a beam pair toward each other, or to bow the two beams in the same direction, and/or to use beam pairs which are not all identical to one another within the same sensor. The bowed beams are also shown as being curved over their entire lengths, but in some cases it may be desirable to have beams that are curved over only a portion of their lengths. Other variations and modifications may also be made without departing from the scope of the appended claims.

What is claimed is:

1. A micromechanical inertial sensor comprising:
    a substrate supporting a pair of spaced-apart fixed structures;
    a proof mass disposed between the fixed structures and oriented lengthwise along a first axis which extends between the fixed structures, the proof mass being adapted to vibrate along a second axis substantially orthogonal to the first axis and being movable along a third axis substantially orthogonal to the first and second axes;
    a sensor system adapted to detect position of the proof mass and provide a signal varying with movement of the proof mass along the third axis; and
    a beam connected between each end of the proof mass and an adjacent one of the fixed structures, the beams suspending the proof mass above the substrate such that the proof mass is movable along the third axis, the beams being adapted to bend to permit vibration of the proof mass along the second axis, each beam being bowed over at least a portion of the length thereof so as to make the beam compliant in the direction of the first axis.

2. The micromechanical inertial sensor of claim 1 wherein each end of the proof mass is suspended from the adjacent fixed structure by a pair of beams spaced apart in the direction of the second axis, each beam being bowed.

3. The micromechanical inertial sensor of claim 2 wherein each beam is bowed in a plane which is parallel to the first axis.

4. The micromechanical inertial sensor of claim 3 wherein the beams are coplanar with the proof mass.

5. The micromechanical inertial sensor of claim 2, further comprising a second proof mass suspended between the fixed structures by a pair of bowed beams attached to each end of the second proof mass, the proof masses being spaced apart in the direction of the second axis.

6. The micromechanical inertial sensor of claim 5 wherein the fixed structures comprise a pair of cross-pieces which extend parallel to the second axis.

7. The micromechanical inertial sensor of claim 6 wherein the beams and the cross-pieces are substantially coplanar.

8. The micromechanical inertial sensor of claim 6 wherein the cross-pieces are affixed to the substrate at portions of the cross-pieces located between the beams of each pair of beams.

9. A method of reducing dependence of the apparent resonant frequency of a proof mass of a micromechanical inertial sensor on drive amplitude of the proof mass, comprising the steps of:

disposing the proof mass between a pair of spaced-apart fixed structures with a lengthwise dimension of the proof mass oriented along a first axis which extends between the fixed structures;

suspending the proof mass between the fixed structures by beams connected between each end of the proof mass and an adjacent one of the fixed structures, such that the proof mass can be forced to vibrate back-and-forth along a second axis substantially orthogonal to the first axis, and such that the proof mass is movable along a third axis which is substantially orthogonal to the first and second axes; and configuring the beams such that at least a portion of each beam is bowed so as to make the beam compliant in a direction parallel to the first axis.

10. The method of claim 9 wherein the configuring step comprises configuring each beam such that the beam is bowed over substantially the entire length thereof.

11. The method of claim 9 wherein the suspending step comprises suspending the proof mass by a first pair of beams attached between one of the fixed structures and one end of the proof mass and a second pair of beams attached between the other fixed structure and the other end of the proof mass, and wherein the configuring step comprises configuring each beam such that the beam is bowed over substantially the entire length thereof.

12. The method of claim 11 wherein the configuring step further comprises bowing the beams of each beam pair in opposite directions.

* * * * *